United States Patent
Kane et al.

(10) Patent No.: US 9,470,712 B1
(45) Date of Patent: Oct. 18, 2016

(54) APPARATUS AND METHOD FOR ATOMIC FORCE PROBING/SEM NANO-PROBING/SCANNING PROBE MICROSCOPY AND COLLIMATED ION MILLING

(71) Applicant: GLOBALFOUNDRIES Inc., Grand Cayman (KY)

(72) Inventors: Terence L. Kane, Wappinger Falls, NY (US); Matthew F. Stanton, Salt Point, NY (US); Robert P. Marsin, Middletown, NY (US); Jochonia N. Nxumalo, Wappinger Falls, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 14/879,645

(22) Filed: Oct. 9, 2015

(51) Int. Cl.
*G01Q 30/20* (2010.01)
*B65D 51/16* (2006.01)
*H01J 37/20* (2006.01)
*H01J 37/305* (2006.01)

(52) U.S. Cl.
CPC ........... *G01Q 30/20* (2013.01); *B65D 51/1644* (2013.01); *H01J 37/20* (2013.01); *H01J 37/3053* (2013.01)

(58) Field of Classification Search
USPC .................................................. 850/8, 9, 18
See application file for complete search history.

(56) References Cited

U.S. PATENT DOCUMENTS

| 8,439,216 B1 | 5/2013 | Walck |
| 8,544,651 B2 | 10/2013 | Zhang et al. |
| 8,596,312 B2 | 12/2013 | Natsume et al. |
| 8,832,960 B2 | 9/2014 | Kim |

FOREIGN PATENT DOCUMENTS

GB         591163         8/1947

OTHER PUBLICATIONS

Model SS100—SampleSaver™ Storage Container; South Bay Technology, Inc.; http://www.southbaytech.com/shop/SS1.shtml http://www.southbaytech.com/pdfs/SampleSaver%20Brochure.pdf.
FIB Fortress™ Holder; Modified Fortress™ Holder; South Bay Technology, Inc. http://www.southbaytech.com/shop/fib1.shtml http://www.southbaytech.com/pdfs/Fortress_FIB_Brochure_LP.pdf.

*Primary Examiner* — Nicole Ippolito
*Assistant Examiner* — Hanway Chang
(74) *Attorney, Agent, or Firm* — Robert Curcio; DeLio, Peterson & Curcio, LLC

(57) ABSTRACT

An apparatus and method for facilitating Atomic Force Microscopy, SEM Nano-Probing, Scanning Probe Microscopy, and Collimated Ion Milling, through the implementation of a removable, magnetized fixture for fixing the position of a sample requiring surface treatment, the fixture attachable to a holder requiring surface treatment, the holder being mountable in various instruments, the fixture being transportable in a container having a magnetized surface plate or disc for magnetic attachment of said fixture, with the container having a valve to permit alternative evacuation and backfill with an inert gas to protect the sample surface.

14 Claims, 15 Drawing Sheets

APPARATUS AND METHOD FOR ATOMIC FORCE PROBING/SEM NANO-PROBING/SCANNING PROBE MICROSCOPY AND COLLIMATED ION MILLING

BACKGROUND OF THE INVENTION

1. Field of the Invention

The present disclosure is directed to low voltage surface preparation for atomic force probing and other measurement techniques. Advantages of low voltage collimated ion milling provides optimum surface finishing for scanning spreading resistance microscopy (SSRM) and scanning capacitance microscopy (SCM) applications, and for atomic force probing (AFP) and scanning electron microscope (SEM) nano-probing applications. More specifically, the present disclosure is directed to a unique SSRM holder or scanning probe microscopy (SPM) holder with a specially design polishing fixture with low voltage, collimated ion milling platen to accomplish low voltage inert collimated ion beam milling; secondary ion mass spectrometry (SIMS) endpoint detection associated with collimated ion milling, which employs rotating, angular focused low kV inert argon beam to the precise layer of interest. The SSRM/SCM holder fixes the surface scan area for iterative collimated ion milling removal and SSRM/SCM imaging of device fins without incident ion beam damage (which may shift the threshold voltage characteristics).

2. Description of Related Art

Surfaces suitable for atomic force probing (AFP), scanning electron microscope nano-probing, scanning probe microscopy (SPM) must be maintained in inert atmosphere but still permit iterative collimated ion milling/delayering with scanning ion mass spectroscopy (SIMS) endpoint detection.

Scanning capacitance metrology requires repeated polishing and reviewing of the sample in an SEM or SCM. Small angular misalignment between planes results in an unusable sample, which becomes more critical when there is only one sample available. Furthermore, tomography of device is needed for 3-D characterization of the samples. This is currently not possible in the prior art because of the angular variation between successive sample preparation steps.

No other means of surface preparation involving low voltage (50 eV to 300 eV) exists in the prior art that is capable of adequately addressing this matter. Furthermore, each sample is unique. Often there is a single failure site to be analyzed; and more often there is a need to repeat the preparation steps to expose the desired site. The prior art does not lend itself to adequate preparation of the sample to the correct location of the site; that is, there is at best an inconsistent approach to the region of interest. Additionally, the failure site may be lost through polishing the plane of interest.

It is further noted that the prior art is far removed from the methodology of the present disclosure insomuch as the prior art a) does not claim SPM/AFM/AFP methods of iterative inspection; b) does not teach an inert gas environment for protecting the surface of sample; c) does not specify a magnetized sample holder or the height of the magnetized sample holder for subsequent planar collimated ion milling, or chemical assisted ion beam etching (CAIBE), or SIMS endpoint detection, or for iterative delayering followed by SPM scanning; d) does not teach a flexible hose to prevent inversion of the container which contains samples during evacuation/purging with the inert gas; e) does not require the surface of the container to be corrosion resistant, flaking resistant, and free of debris/oxidization; and f) does not claim dual purpose containers for AFP/SEM nano-probing applications as well as SPM applications.

SUMMARY OF THE INVENTION

Bearing in mind the problems and deficiencies of the prior art, it is therefore an object of the present disclosure to facilitate Atomic Force Probing, SEM Nano-Probing, Scanning Probe Microscopy, and Collimated Ion Milling, through the implementation of a removable fixture attachable to a holder that can be mounted in various instruments, the fixture being transportable in a container having a valve to permit alternative evacuation and backfill with an inert gas to protect the sample surface.

It is another object of the present disclosure to eliminate the need for inspection after collimated ion beam milling.

The above and other objects, which will be apparent to those skilled in the art, are achieved in the present disclosure which is directed to a fixture and die combination, the die secured to the fixture in a fixed position for surface preparation and measurement, the fixture comprising magnetized stainless steel, the fixture attachable to a holder by magnetic attraction, wherein the holder is detachably mounted in a die surface treatment instrument for: auto polishing, atomic force microscopy, scanning spreading resistance microscopy (SSRM), scanning capacitance microscopy, scanning electron microscope nano-probing, scanning probe microscopy, or secondary ion mass spectrometry, or any combination thereof.

The fixture is removable from the holder and attachable to an ion milling platen. The fixture is also removable from the holder and magnetically attachable to a plate or disc in a transport container, the transport container including: a cover sealingly engaging the container, the cover having a valve attached thereto, the valve connected to a flexible hose for evacuating or admitting inert gas within the container; a support column extending from the cover within the container, the support column attached at one end to the cover, and at an opposite end to the plate or disc, the plate or disc having at least one magnetic plug; and the fixture magnetized to releasably attach to the magnetic plug. The at least one magnetic plug is embedded within the bottom surface plate or disc.

The fixture mates to conventional mechanical polishing and analytical tools, but permits subsequent low voltage collimated ion milling with SIMS endpoint to allow precise, reproducible delayering without optical or SEM inspection methods, the low voltage in the range of 50 eV to 300 eV.

In a second aspect, the present disclosure is directed to a method for providing a low voltage inert collimated ion beam milling to achieve reproducible, uniform, planar processing of a sample surface for subsequent scanning, the method including: obtaining a sample and identifying the failing site or region of interest on the sample; mounting the sample onto a mobile fixture; mounting the fixture onto a holder; mounting the holder onto a tool mount stub; performing a preparation process; demounting the holder from the tool mount stub; mounting the holder on an examination tool stub; determining the region of interest, if the region of interest is too far repeat the method steps beginning with obtaining the sample and identifying the failing site, if the region of interest is not available, repeating the method steps beginning with mounting the holder on the tool mount stub, if the region of interest is obtained, demounting the holder from the examination tool stub; and performing SPM or other surface treatment analysis.

The method may include performing iterative collimated ion milling at low voltages in the range of 50 eV to 300 eV.

In a third aspect, the present disclosure is directed to a method for providing a low voltage inert collimated ion beam milling to achieve reproducible, uniform, planar processing of a sample surface for subsequent SPM/SSRM scanning, the method includes providing: mounting a sample on a fixture having an increased height to expose the sample top surface in a height or Z-direction; mounting the fixture on an SSRM/SCM holder for fixing a surface scan area for iterative collimated ion milling removal; mounting the holder to an ion milling platen; performing collimated ion milling on the sample; performing a SIMS endpoint detection associated with the collimated ion milling; and performing SSRM/SCM imaging of the sample without incident ion beam damage.

The collimated ion milling includes rotating an angular focused low kV inert argon beam to a precise region of interest on the sample surface that eliminates a need for SEM inspection.

An increase in height of the sample in the Z-direction permits iterative collimated ion milling at low voltages in the range of 50 eV to 300 eV of the scanned region of interest.

A modification of existing collimated ion milling shutter assemblies uses spacers to increase height in the Z-direction for spacing between the shutter and the sample.

In a fourth aspect, the present disclosure is directed to a container for transporting and securing at least one die for surface preparation and measurement, the container comprising: a cover sealingly engaging the container, the cover having a valve attached thereto, the valve connected to a flexible hose for evacuating or admitting inert gas within the container; a support column extending from the cover within the container, the support column attached at one end to the cover, and at an opposite end to a plate or disc, the plate or disc having at least one magnetic plug; and at least one fixture for securing the at least one die in a fixed position, the fixture magnetized to releasably attach to the magnetic plug.

The measurement includes: atomic force probing, scanning spreading resistance microscopy (SSRM), scanning capacitance microscopy, scanning electron microscope nano-probing, scanning probe microscopy, or secondary ion mass spectrometry, or any combination thereof.

The at least one magnetic plug is embedded within the bottom surface plate or disc, and the at least one fixture is magnetized stainless steel.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
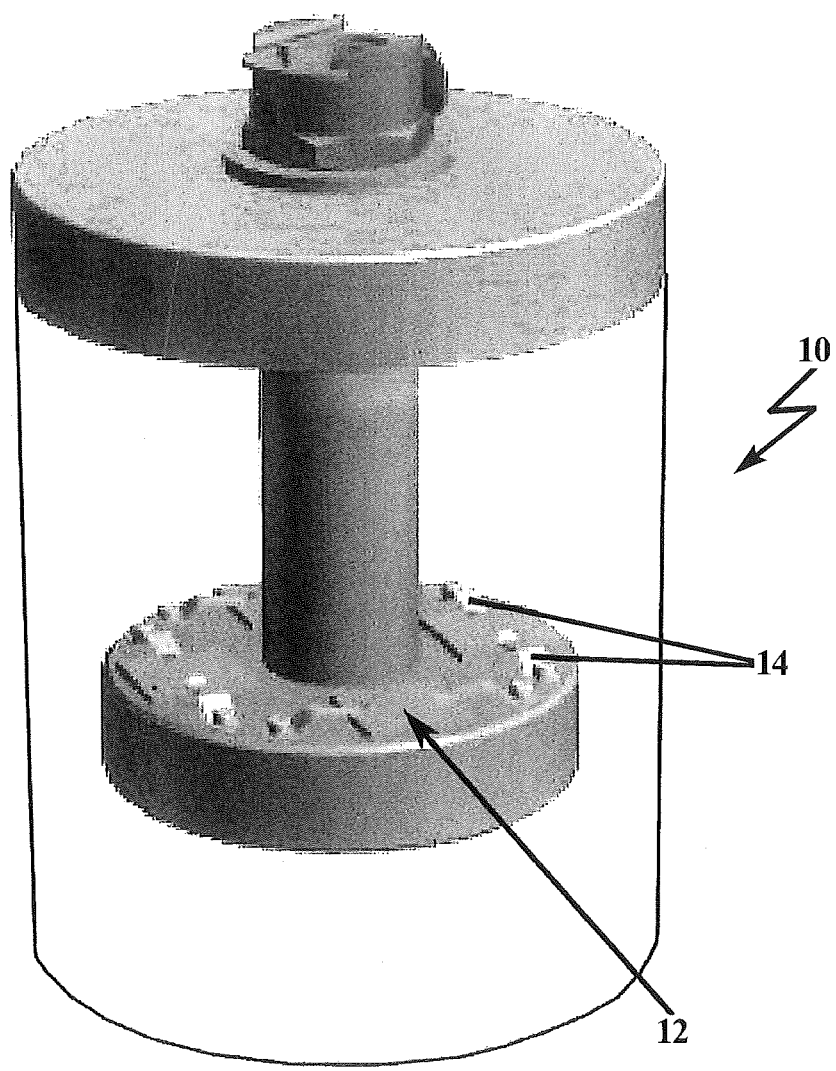
FIG. 1 depicts a container holding multiple die with clips in a purged and inert gas atmosphere for Atomic Force Probing/SEM nano-probing applications.

In describing the preferred embodiment of the present disclosure, reference will be made herein to FIGS. 1-15 of the drawings in which like numerals refer to like features of the invention.

Physical SPM, atomic force electrical probing of leading edge technology devices, including below 14 nm finFET (tri-gate) devices, SEM nano-probing, scanning probe microscopy, and collimated ion milling without optical or SEM inspection, require surface preparation (iterative delayering) and protection for subsequent atomic force microscopy (AFM), scanning spreading resistance microscopy (SSRM), or SCM scanning, which is addressed by the methodology of the present disclosure. Different approach methodologies involving sequential steps of delayering, collimated ion milling with precise, predictable removal rates are not possible with manual or mechanical removal techniques, and without avoiding incident SEM/FIB inspection techniques.

To remedy the deficiencies of the prior art, inspection processes are eliminated, which removes unnecessary contact and handling of the sample. To further this new procedure, a novel dual purpose sample holder and magnetized sample fixture is introduced that is employed with the scanning probe, AFM, and ion miller. A storage/transport container is further employed, including a the magnetized fixture for mating with conventional mechanical polishing tools, but permitting subsequent low voltage (50 eV to 300 eV) collimated ion milling with a Secondary Ion Mass Spectrometer (SIMS) endpoint detection. The container has a valve to permit alternative evacuation and can be backfilled with inert gas to protect the surface. A flexible hose is also employed to prevent the need for inversion of the container during evacuation and purging with inert gas. Iterative ion milling followed by SPM inspection eliminates the need for incident energetic ion beams or focused ion beams (FIB) that can affect electrical properties and surface characteristics measured by atomic force probing and SPM methods.

The magnetized stainless steel fixture is used for mating to the ion miller platen, exposing the sample surface in a third (Z) direction. The fixture also assists in mating to conventional mechanical/polishing tools. The fixture permits subsequent low voltage (50 eV to 300 eV) collimated ion milling with a SIMS endpoint detection that allows for precise, reproducible delayering without optical or SEM inspection methods. It also mates to the AFM instrumentation.

The magnetized stainless steel fixture enables low voltage collimated ion beam milling and chemical assisted ion beam etching (CAIBE) for precise removal as determined by the SIMS endpoint detector.

The magnetic stainless steel fixture mates to a mechanical polishing tool, subsequent ion milling platen, and various SSRM/AFM/SCM tools for non-destructive inspection, which enables SSRM/SCM inspection, especially of finFET devices.

The present methodology is applied to 14 nm or less finFET devices where the surface of high-κ metal gates around fins of finFET devices is especially sensitive to incident energetic ion beams (above 300 eV).

Advantages of low voltage collimated ion milling provides optimum surface finishing for SSRM and SCM applications, and for AFP/AFM and SEM nano-probing applications.

Furthermore, iterative ion milling followed by SPM scanning avoids incident energetic ion beams or focused ion beams that can affect electrical properties and surface characteristics measured by AFM and SPM methods.

In this manner, evacuation of the container vacuum and having the backfill purged with inert gas offers the best protection of surface for AFM electrical probing and SCM/SSRM scanning.

Figure 2:
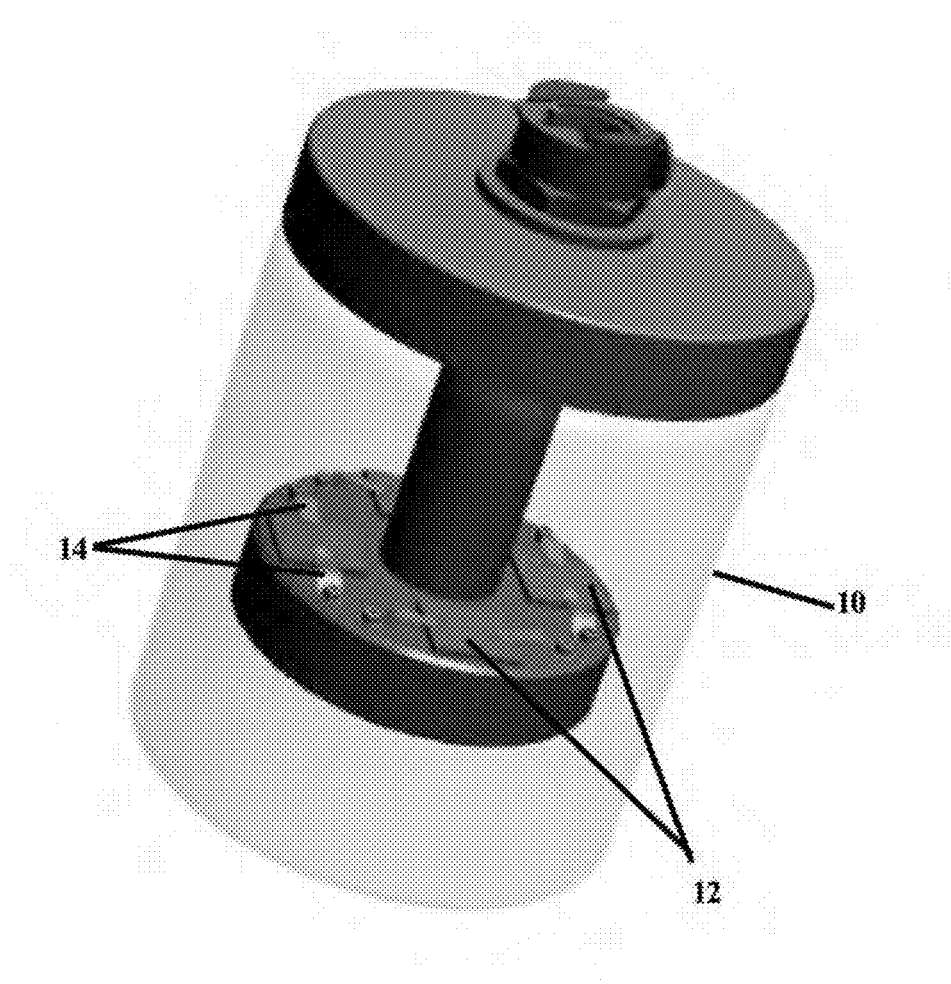
FIG. 2 depicts a perspective view of the container of FIG. 1.

FIG. 1 depicts a container 10 holding multiple die 12 with clips 14 in a purged and inert gas atmosphere for Atomic Force Probing/SEM nano-probing applications. FIG. 2 depicts a perspective view of the container 10 of FIG. 1.

Figure 3:
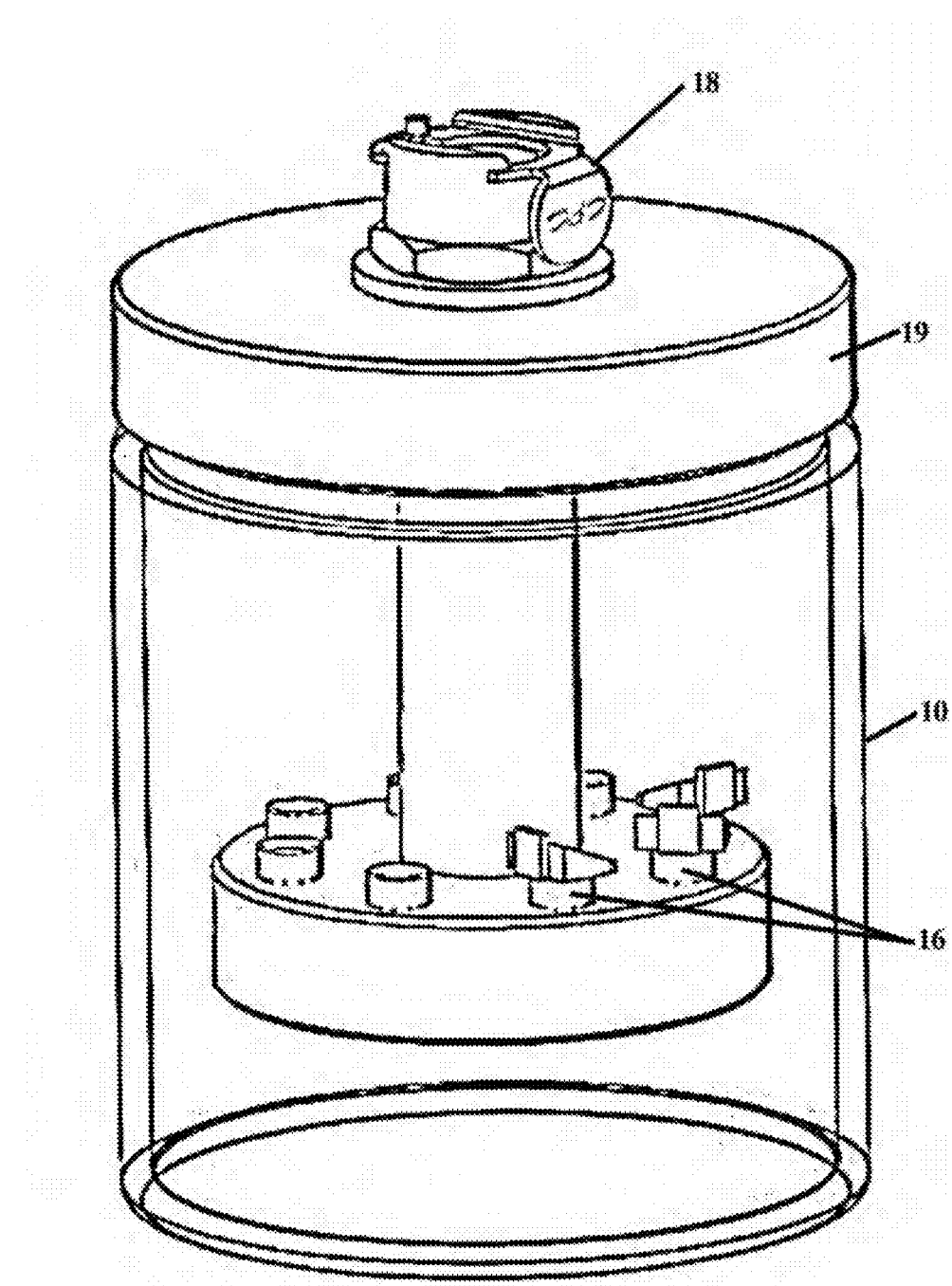
FIG. 3 depicts the container of FIG. 1 holding multiple SSRM/SCM samples and having a valve for purging and/or vacuum evacuating the container, and which can subsequently admit inert gas.
Figure 4:
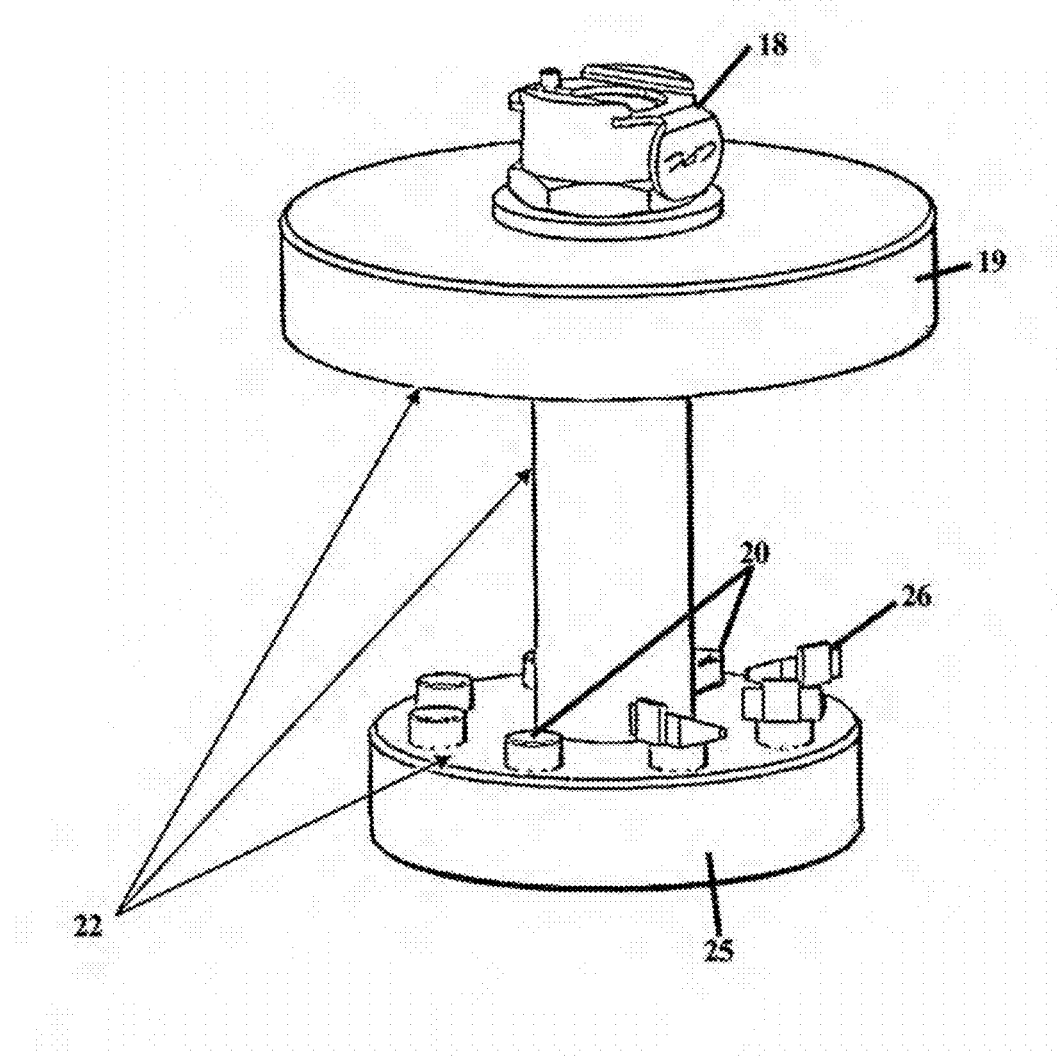
FIG. 4 is a view of the container of FIG. 3 with the enclosure removed, depicting magnetic plugs for a SSRM/SCM holder.

FIG. 3 depicts the container 10 of the present disclosure holding multiple SSRM/SCM samples 16 with a valve 18 located on a removable, sealable top 19 for purging and/or vacuum evacuating the container, and which subsequently facilitates the admission of inert gas. FIG. 4 is a view of the container 10 of FIG. 3 with the enclosure removed, depicting magnetic plugs 20 for SSRM/SCM holders 26. The magnetic plugs extend from the top surface of bottom support structure 25. The housing materials as shown at particular locations 22, is designed to be corrosion resistant to flaking and cracking.

Figure 5:
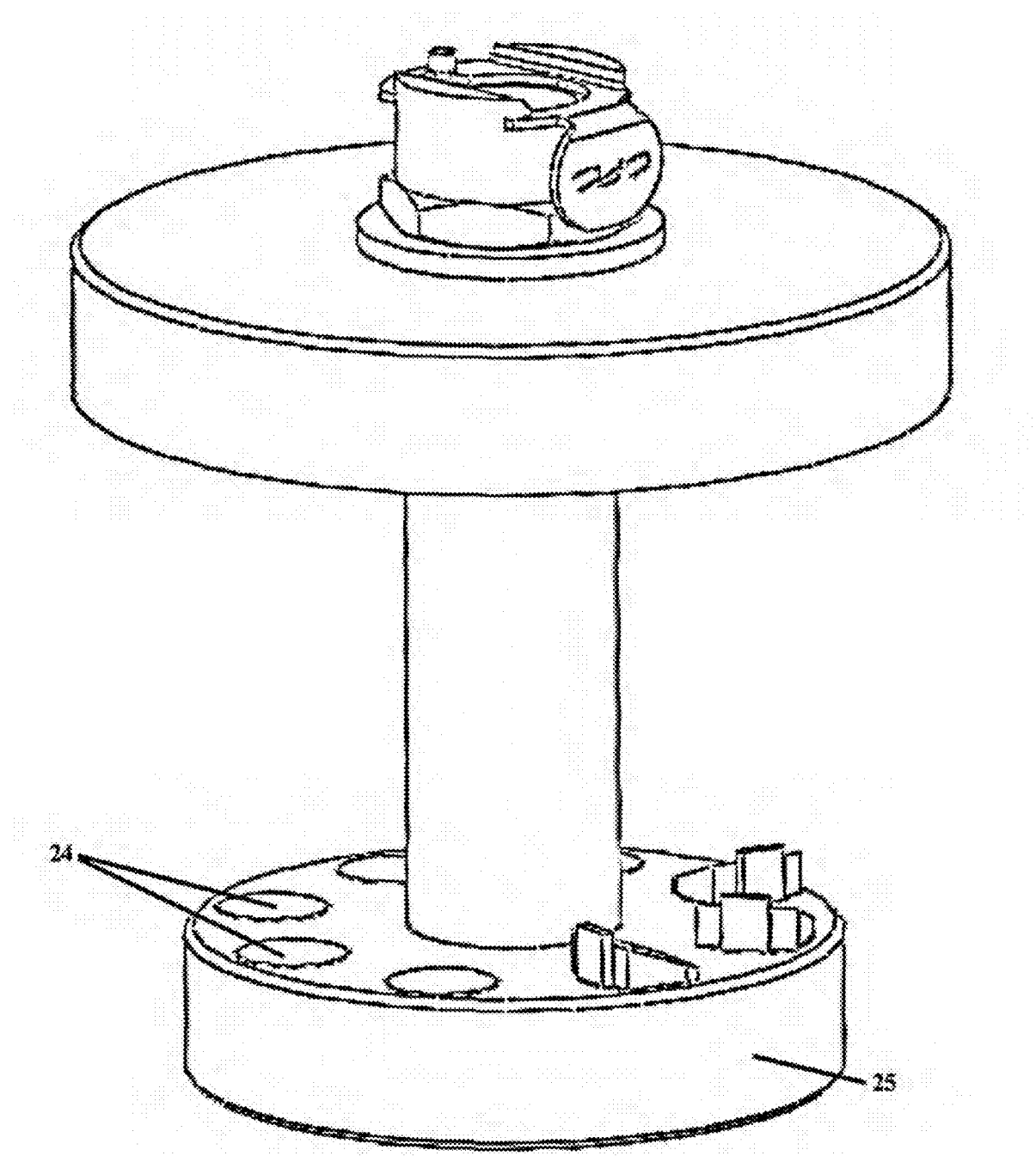
FIG. 5 depicts the SCM/SPM/SSRM container with embedded magnets used to retain the SCM holder.

FIG. 5 depicts the SCM/SPM/SSRM container with embedded magnets 24 within bottom support structure 25, used to retain the magnetically attachable SCM holder 26.

A low voltage (50 eV to 300 eV) incident beam exposure is introduced for Front End of Line (FEOL) device surfaces, and facilitates the protection of these surfaces for iterative low voltage collimated ion milling, SSRM/SCM for atomic force electrical probing, SEM nano-probing, as well as SSRM and SCM scanning.

The embedded magnets 24 used to hold SPM/SCM/SSRM sample in the vacuum purged/inert gas container 10 are detailed below along with detailed description of the sample holder held by the magnets.

Embedding magnets in a vacuum evacuated and purged container to retain a SPM/SCM/SSRM holder of ferromagnetic material, that mates to SCM/SSRM tools, enables retaining the fixture that holds the sample (e.g., a silicon chip), and is attached to the holder, without cumbersome attachment schemes, such as screws, bands, and the like, and allows for easy interchangeability of the holder. The sample may be attached to the fixture by adhesive means.

As noted previously, container 10 is equipped with valve 18, which is designed to attach to a hose (preferably a flexible hose) to prevent the need for inversion of the container during evacuation and purging with inert gas. Iterative ion milling followed by SPM inspection eliminates the need for incident energetic ion beams or focused ion beams that can affect electrical properties and surface characteristics measured by AFM and SPM methods.

Scanning capacitance metrology requires repeatedly polishing and reviewing the sample in an SEM or SCM. Small angular misalignment between planes results in an unusable sample, which may prove critical if there is only one sample available, as is often the case in failure analyses. Furthermore, tomography of devices is needed for three-dimensional characterization of samples. This is not possible in the prior art because of angular variation between successive sample preparation steps. Each sample is unique, and often there is a single failure site to be analyzed. Preparation steps may need to be repeated to expose the location of the desired site. However, this poses technical problems in testing resulting in low yield of sample preparation. Inadequate preparation of the sample to the correct location, along with an inconsistent approach to the region of interest can misalign (or ultimately lose) the failure site location, which could, for example, result in inadvertent polishing through the plane of interest. Consequently, the preferred mounting fixture is made to be mobile—attachable and detachable with little or no added mechanical components.

Figure 6:
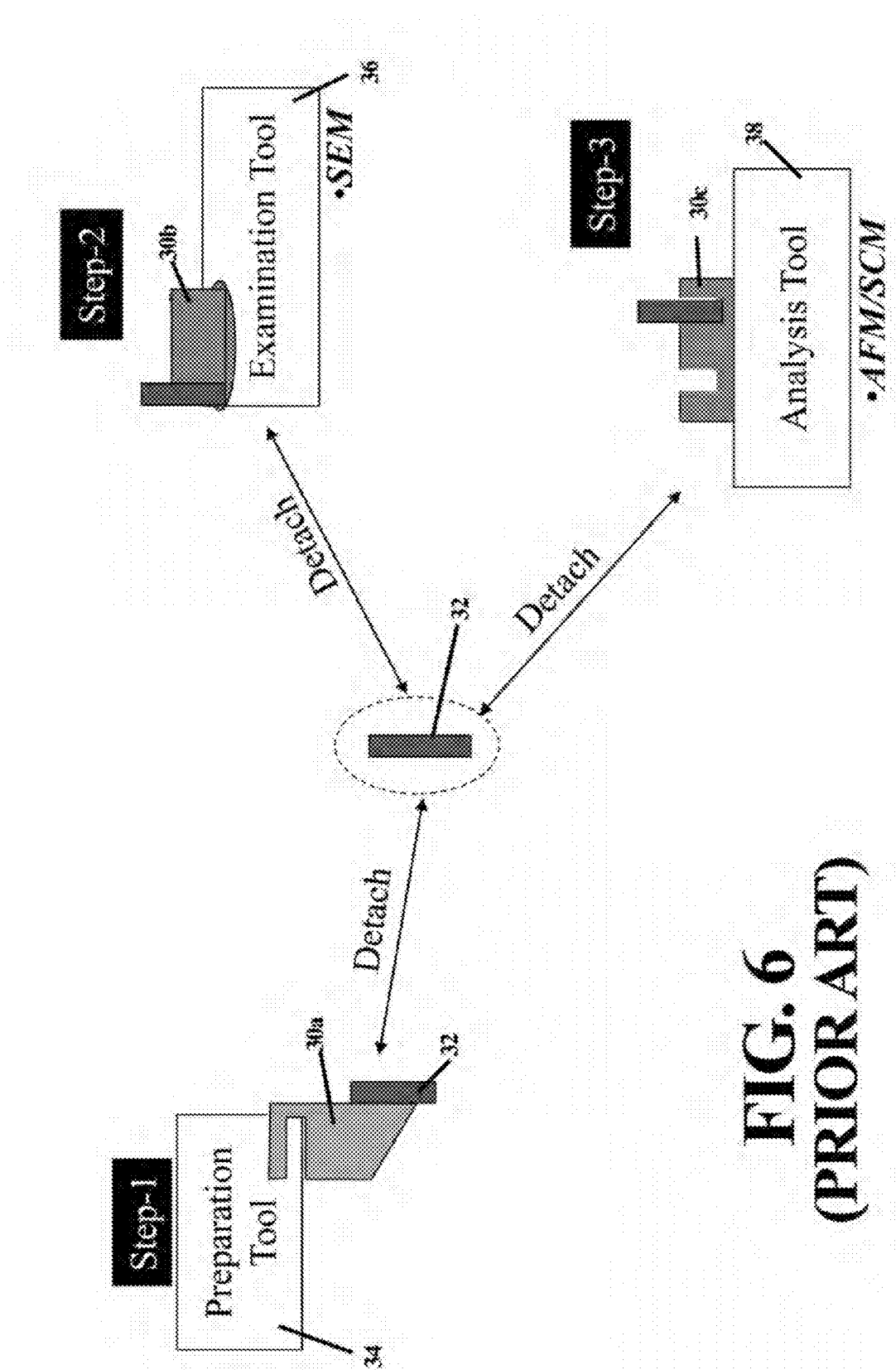
FIG. 6 depicts the prior art process for the mounting and detachment of the sample from different testing tools.

FIG. 6 depicts the prior art process for the mounting and detachment of the sample from different testing tools. In this example, each mount 30a,b,c is tool specific. In Step 1, mount 30a attaches sample 32 to a preparation tool 34. In Step 2, sample 2 is then detached and reattached to mount 30b for an examination tool 36, which for example may be an SEM. To initiate Step 3, sample 32 is detached again and mounted to mount 30c for an analysis tool 38, such as an AFM/SCM.

Under this prior art approach, there may be multiple iterative cycles between steps. The required site may be reached after several repeat processes. In each instances, the specimen or sample 32 is re-attached to mount 30a in Step 1 to start the cycle. This is a cumbersome procedure, and lends itself to alignment errors. During sample re-attachment, the planes of the sample may be at different angles, which may result in the loss of the region of interest.

Figure 7A:
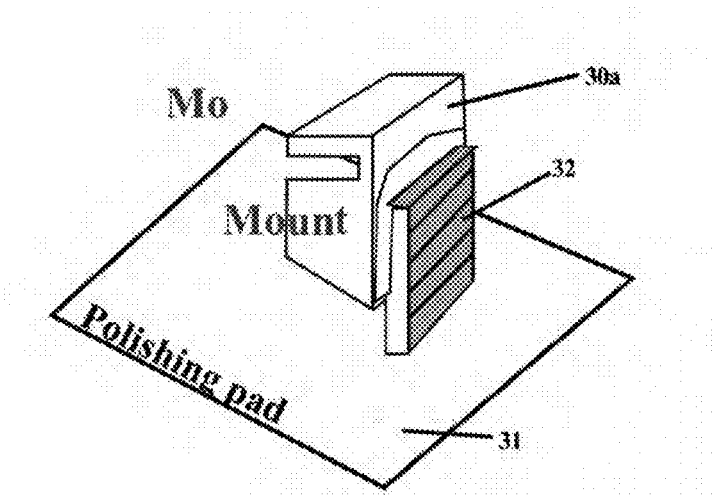
FIG. 7A depicts a sample mounted on a sample holder (mount) and exposed to a polishing pad.
Figure 7B:
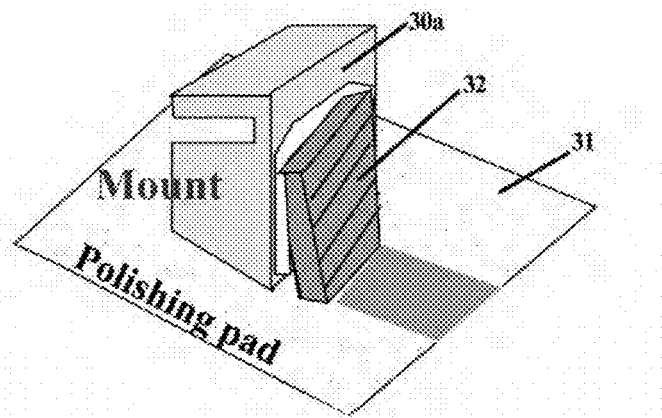
FIG. 7B depicts the mounted sample of FIG. 7A after re-attachment, indicating misalignment.

FIG. 7A depicts a sample 32 mounted on a sample holder (mount) 30a and exposed to a polishing pad 31. FIG. 7B depicts the mounted sample of FIG. 7A after re-attachment, indicating misalignment. The present disclosure eliminates this misalignment by fixing the sample to a fixture that is magnetized and therefore detachable without adjustment of the sample itself.

Figure 8:
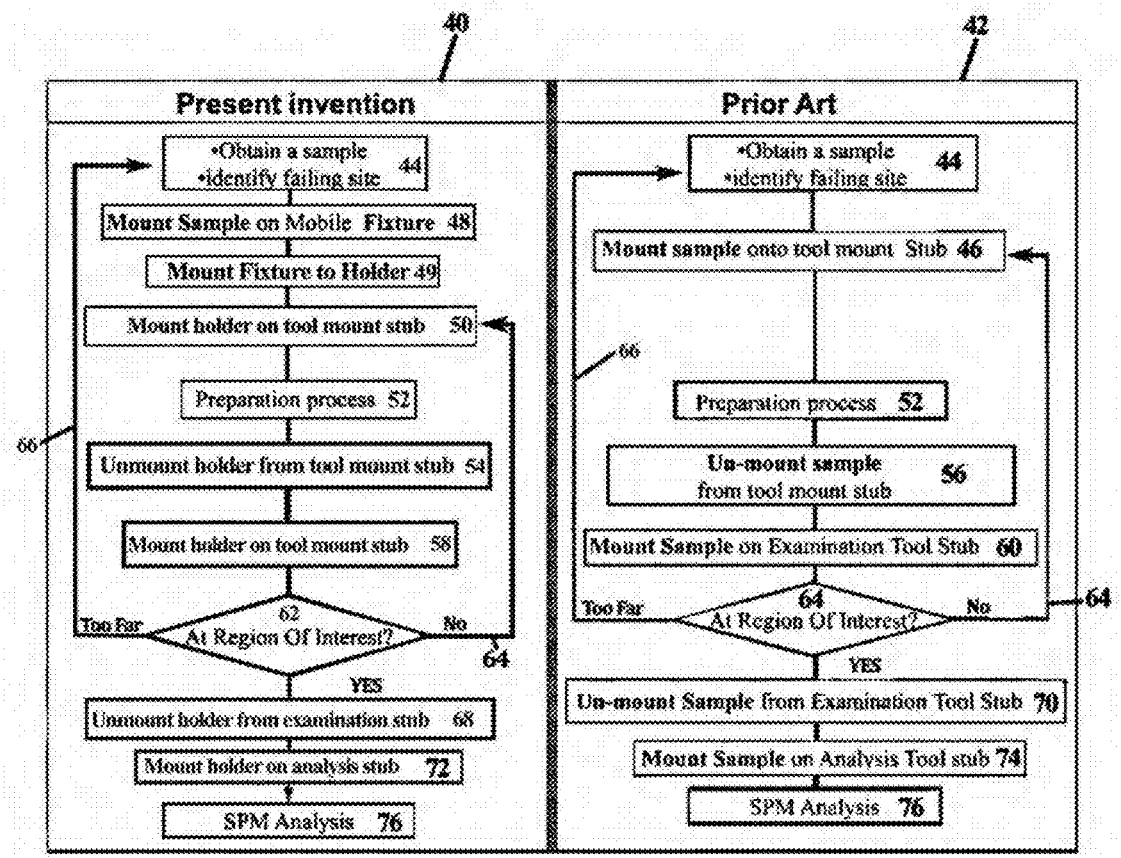
FIG. 8 depicts the process flow of the present disclosure and the prior art process flow in side-by-side flow charts, for direct comparison.

In order to demonstrate a comparison to the prior art methodology, the process of the present disclosure and the prior art process flow are depicted by side-by-side flow charts 40, 42 respectively, as shown in FIG. 8.

First, in both process flows, a sample is obtained and the failing site identified 44. Next, the sample is mounted onto a tool mount stub 46 in the prior art, but in the present disclosure the sample is mounted to a mobile fixture 48. In this regard, the present disclosure has the additional step of next mounting the mobile fixture 48 to a holder 49, which is then mounted on to the tool mount stub (step 50). The preparation process 52 is then initiated. This assumes that the orientation is correct (in the case of a finFET device, for example, the orientation is parallel or perpendicular to the fin).

In the present disclosure, during a detach/re-attachment the holder is demounted from the tool mount stub (step 54). In contrast, in the prior art, the sample is unmounted from the tool mount stub (step 56). The prior art requires the handling and movement of the sample itself. The present disclosure eliminates these handling errors. Next, in the present disclosure, the holder is mounted to the examination tool stub (step 58); whereas, in the prior art, the sample is directly mounted to the examination tool stub (step 60).

The first decision point 62 is reached. If the Region of Interest is not exposed and accessible (64), the holder is mounted on the tool mount stub (50) in the present disclosure. (In the prior art, the sample is mounted to the tool mount stub 46. If the Region of Interest is too far 66, the procedure is restarted at step 44.

If the Region of Interest is exposed and accessible, the holder is demounted from the examination tool stub 68. (In contrast, in the prior art, the sample itself is demounted from the examination tool stub 70.)

Next, the holder is mounted on an analysis tool stub (step 72), and analysis is performed (step 76), such as SPM analysis. Again, in the prior art, it is the sample itself that is mounted (step 74), not a holder or fixture securing the sample.

The mobile holder/fixture combination of the present disclosure is adaptable to: polishing instruments, both automatic and manual; inspection instruments (SEM and optical); and data collection instruments (SCM, AFM). The mobile fixture is preferably made of magnetized stainless steel. The holder is of a material that allows for magnetic attraction to the fixture.

The advantages of the process methodology of the present disclosure include: minimize the sample handling (mounting reduced to only one action); increase the turn-around time; increase the sample yield; and achieve 3-D tomography, by allowing the sample surface to be exposed in the Z-height dimension.

The present disclosure provides a solution to the above-identified prior art deficiencies. The removable holder can be attached to a sample mount inside numerous FA sample preparation and analysis tools. A sample is attached only once to the mobile fixture and not removed from the fixture until the analysis is completed, thus maintaining the sample in set position. The magnetized fixture is detachable from its holder.

Figure 9:
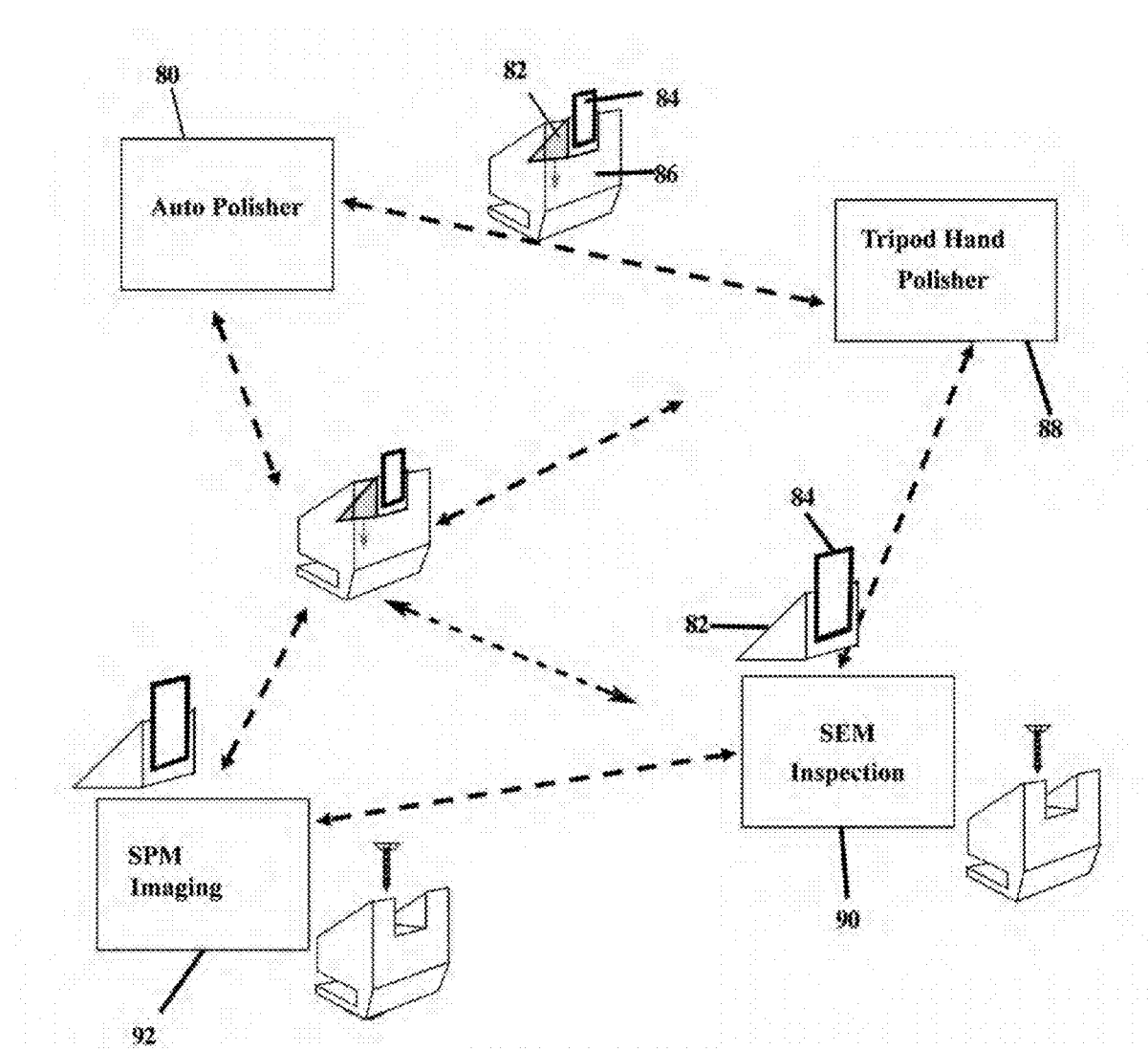
FIG. 9 depicts a sample fixture flow of the present disclosure.

A sample fixture flow of the present disclosure is depicted in FIG. 9. An auto polisher 80 utilizes a fixture 82 having a sample 84 mounted thereon, the fixture 82 being attached to a removable holder 86. The holder 86 is moved to a tripod hand polisher 88, and then to an SEM Inspection station 90 and ultimately to SPM Imaging, 92 and reverse flow.

During storage and/or transport of the fixture, a transport container is first vacuum pumped and then preferably backfilled to a predetermined level (e.g., 15 psi) of inert gas (typically nitrogen) to remove moisture and guarantee optimum integrity of exposed the silicon surface of the sample following ion milling and/or SPM imaging (AFM imaging and/or SSRM imaging). The container is designed to minimize outgassing, which can cause internal surfaces to gather or attract charge.

Magnets are integrated into internal surfaces to enable the securing of ferromagnetic sample fixtures for common polishing tools, the ion miller tool, or the SPM tools (both SCM and SSRM tools). This magnetic method of attraction also enables shipment of samples between different locations (ion miller and SPM model). Magnetic securing of the ferromagnetic fixture to the container support surface minimizes the risk of handling errors and other contaminant sources.

As demonstrated, the mobile fixture may be used in several instruments, e.g., a CENTOR Profiler, a South Bay Tripod Polisher, an SEM and an AFM/SCM, to name a few. Through this new process, the sample prep yield is increased; and 3-D Tomography is achievable.

This unique SSRM/SPM holder with specially designed polishing fixture with low voltage, is utilized in collimated ion milling platen to accomplish following:

1) low voltage (50 eV to 300 eV) inert collimated ion beam milling to achieve reproducible, uniform, planar de-processing of the sample surface for subsequent SPM/SSRM scanning;

2) SIMS endpoint detection associated with collimated ion milling employs rotating, angular focused low kV inert argon beam to precise layer of interest that eliminates need for SEM inspection;

3) the SSRM/SCM holder fixes the surface scan area for iterative collimated ion milling removal and SSRM/SCM imaging of device fins without incident ion beam damage, which shifts threshold voltage characteristics;

4) a sharp endpoint radius for SSRM/SCM probe tips enables high resolution imaging of finFET features without incident ion beam damage and/or gallium ion beam implantation associated with FIB, SEM, or TEM inspection methods;

5) imaging of fin features by SSRM/SCM enables differentiation of the dopant fin region as compared to silicon germanium in the merged epitaxial region surrounding the fin;

6) modification of existing collimated ion milling shutter assemblies using spacers to increase Z height spacing between shutter and sample. This additional height permits iterative collimated ion milling at low voltages (50 eV to 300 eV) of scanned region via SPM/SSRM; and 7) eliminates the need for SEM/FIB inspection and legacy mechanical polishing steps (legacy mechanical polishing processes are non-planar in nature as well as introducing artifacts (scratches, amorphization damage, topography height variations).

The present disclosure facilitates Atomic Force Probing, SEM Nano-Probing, Scanning Probe Microscopy, and Collimated Ion Milling. It does this through the implementation of a removable fixture attachable to a holder that can be mounted in various instruments, the fixture being transportable in a container having a valve to permit alternative evacuation and backfill with an inert gas to protect the sample surface. A flexible hose is used to avoid inverting the container during evacuation and backfill which protects the sample surface during iterative ion milling, which follows conventional mechanical polishing.

A magnetic stainless steel fixture mates to conventional mechanical polishing and analytical tools, but permits subsequent low voltage collimated ion milling with SIMS endpoint to allow precise, reproducible delayering without optical or SEM inspection methods. The fixtures also allow chemical assisted ion beam etching (CAIBE) for precise removal as determined by an SIMS endpoint detector. The fixture further mates with ion milling platen and various SSRM/AFC/SCM tools for non-destructive inspection, enabling SSRM/SCM inspection, especially of finFET devices.

Figure 10:
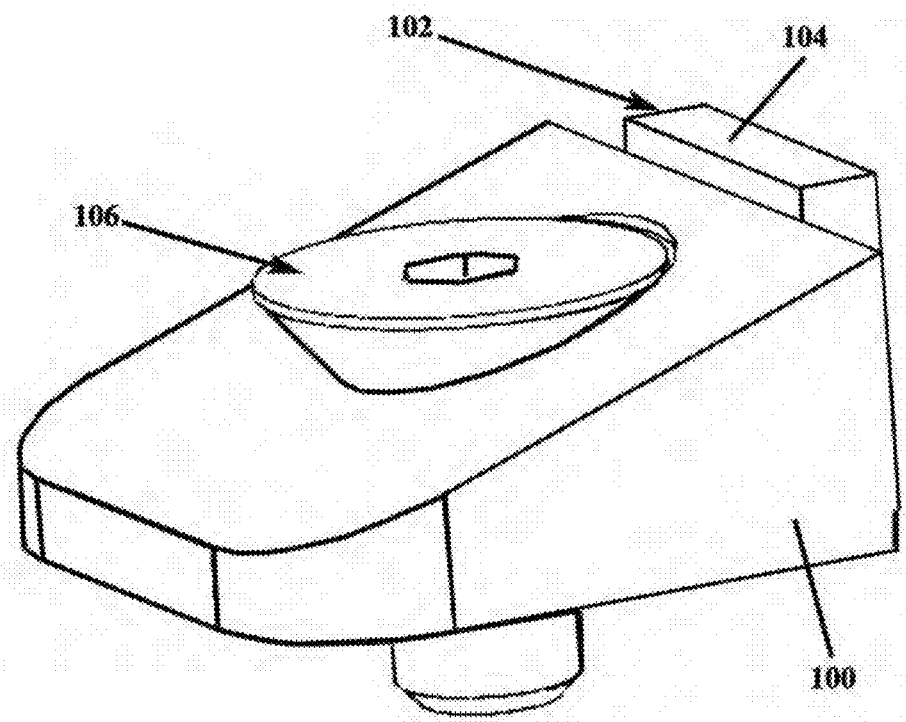
FIG. 10 depicts a detailed view of an SSRM/SCM sample holder.

FIG. 10 depicts a detailed view of an SSRM/SCM sample fixture 100. The SSRM/SCM sample 102 has an exposed sample surface 104. An attachment screw 106 is used for mechanical, legacy manual polishing, SPM tools, and for attachment to a collimated ion milling non-magnetized platen.

Figure 11:
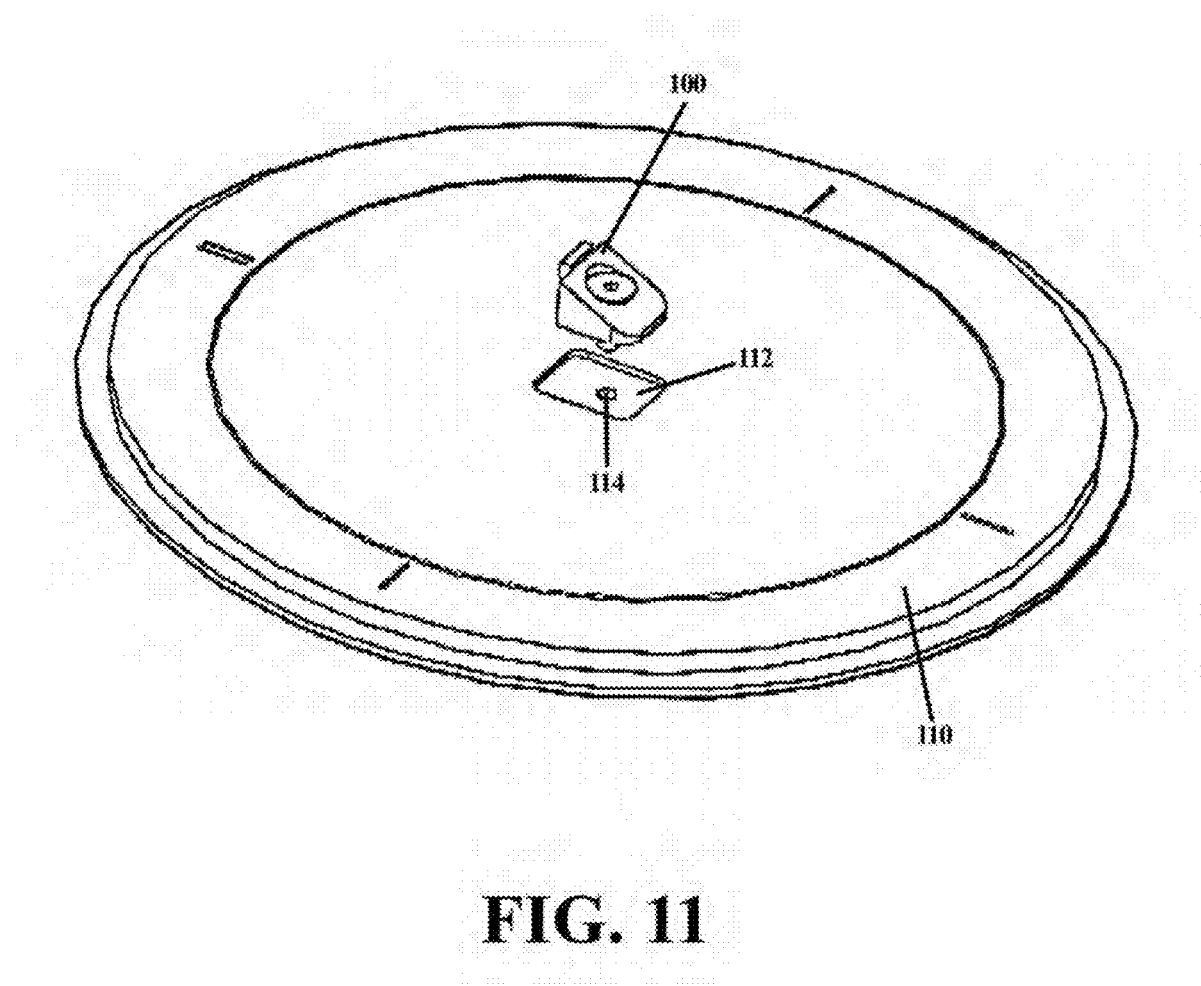
FIG. 11 depicts the SSRM/SCM sample holder of FIG. 10 being fixed to an ion milling platen, where the ion milling platen includes a recess for insertion of the sample holder, and an attachment well for insertion of an attachment screw.

FIG. 11 depicts the SSRM/SCM sample holder 100 of FIG. 10 being fixed to an ion milling platen 110 by a screw attachment, although other attachment schemes are not precluded. Ion milling platen 110 includes a recess 112 for insertion of sample fixture 100, and an attachment well 114 for screw 106.

Figure 12:
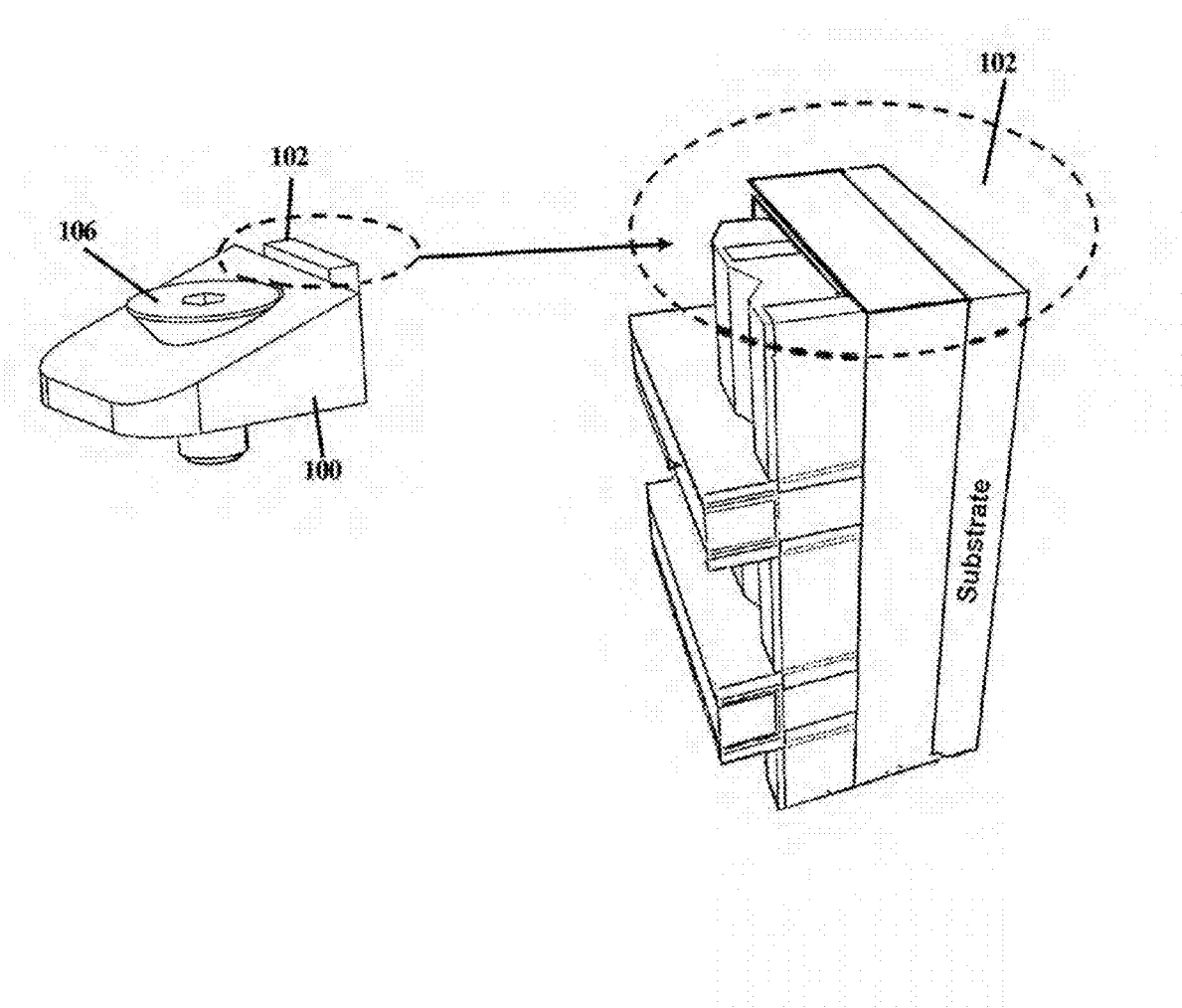
FIG. 12 depicts an exploded view of the sample surface 104 in an illustrative finFET device that is to be protected.

FIG. 12 depicts an exploded view of the sample in an illustrative finFET device that is to be protected. In this embodiment, the orientation is perpendicular to the fins of a finFET device.

Figure 13:
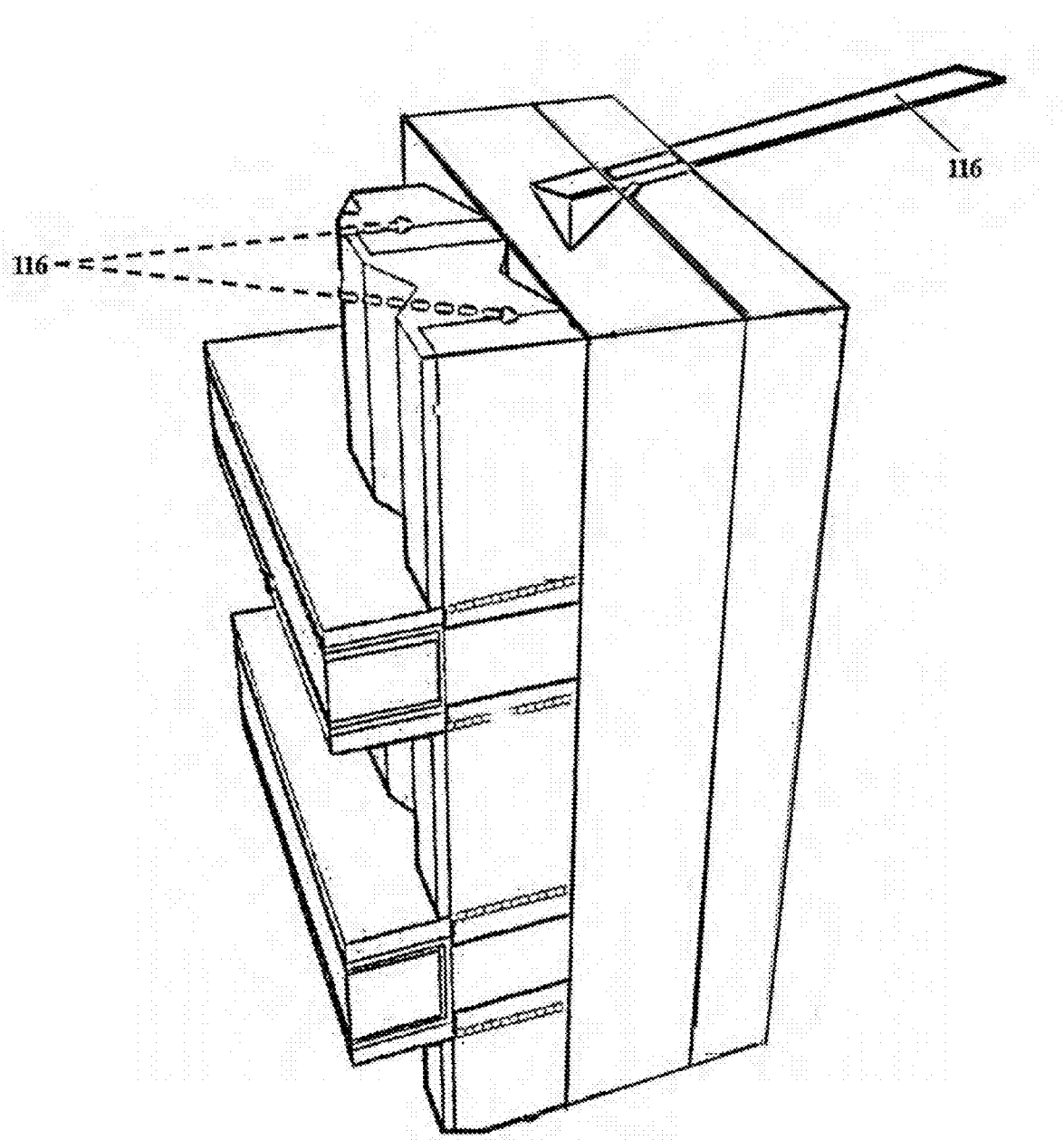
FIG. 13 depicts an SSRM/SCM probe, which is scanning perpendicular to the fin of a finFET device.

FIG. 13 depicts a higher magnification of FIG. 12 that includes an SSRM/SCM probe 116, which is scanning perpendicular to the fin, as depicted by arrows 118.

Figure 14:
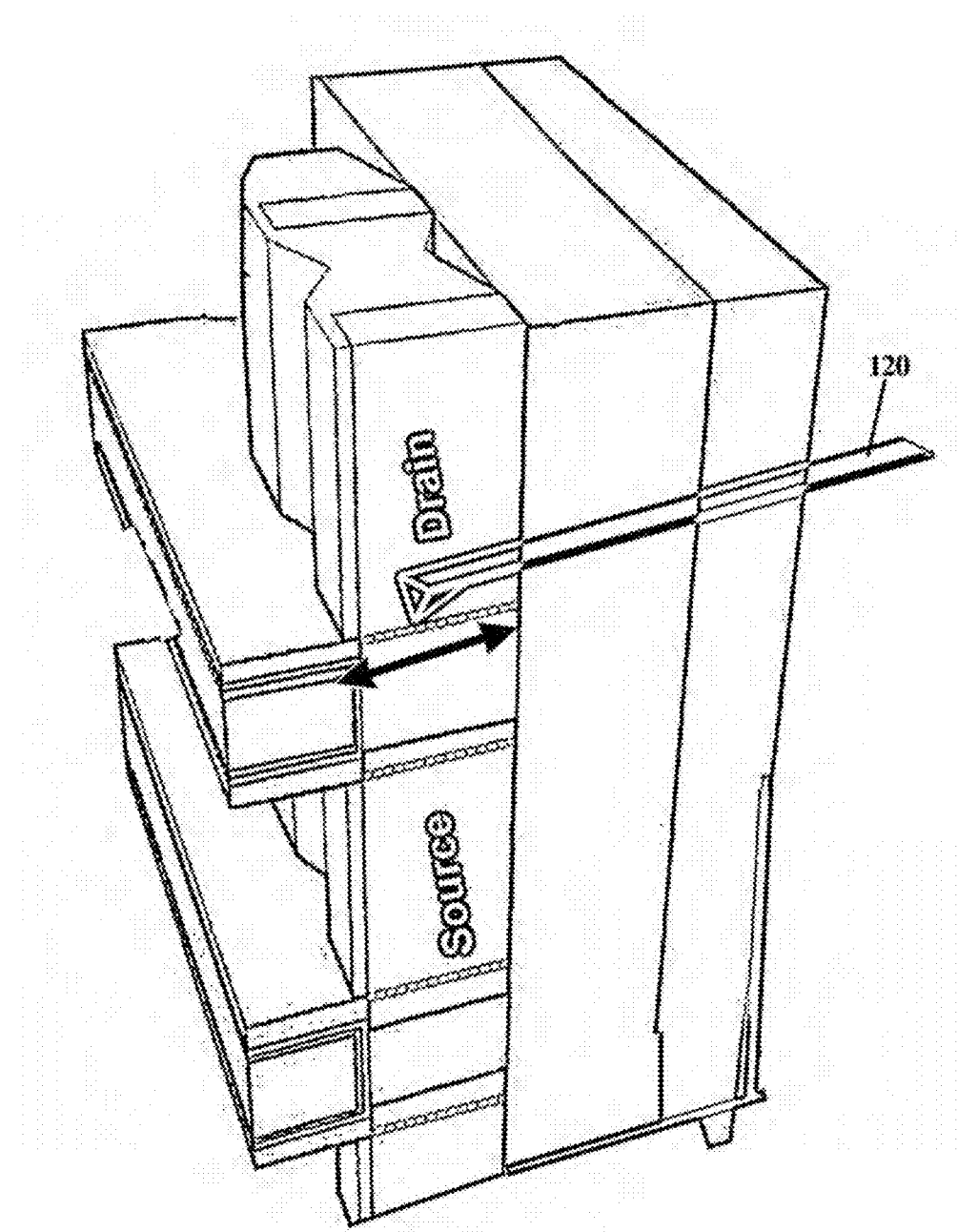
FIG. 14 depicts an SSRM/SPM scanning probe parallel to the fin of a finFET device.

FIG. 14 depicts an SSRM/SPM scanning probe 120 parallel to the fin.

Figure 15:
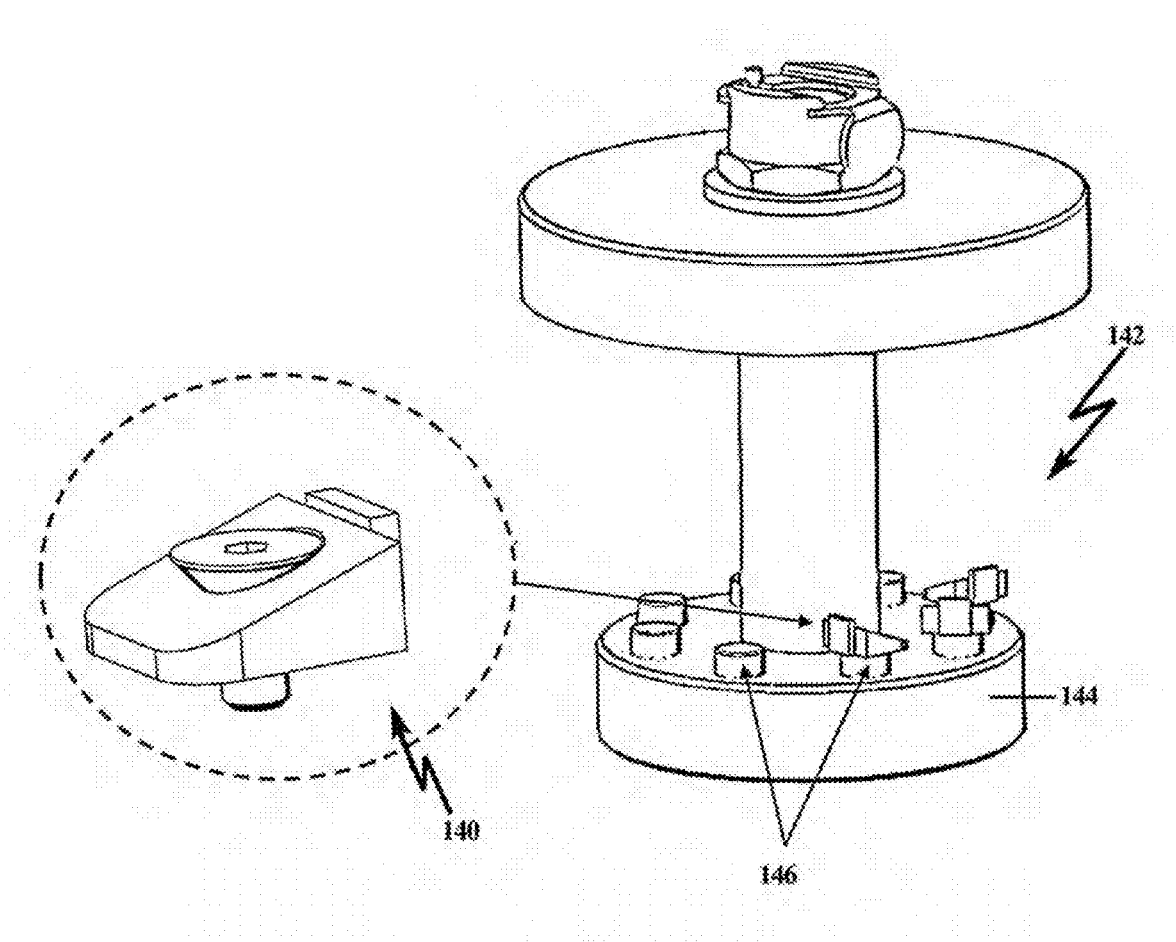
FIG. 15 depicts a universal stainless steel holder designed to fit AFM, SSRM/SCM tools for subsequently collimated ion milling, and is shown attached to the bottom support surface of a valved, canister holder, as attached by magnetic plugs.

FIG. 15 depicts a universal stainless steel fixture 140 designed to fit AFM, SSRM/SCM tools for subsequently collimated ion milling, and is shown attached to the bottom support disc 144 of the valved, canister holder 142 by magnetic plugs 146.

While the present disclosure has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present disclosure.

Thus, having described the invention, what is claimed is:

1. A fixture and die combination, said die secured to said fixture in a fixed position for surface preparation and measurement, said fixture comprising magnetized stainless steel, said fixture attachable to a holder by magnetic attraction, wherein said holder is detachably mounted in a die surface treatment instrument for: auto polishing, atomic force microscopy, scanning spreading resistance microscopy (SSRM), scanning capacitance microscopy, scanning electron microscope nano-probing, scanning probe microscopy, or secondary ion mass spectrometry, or any combination thereof, wherein said fixture is removable from said holder and magnetically attachable to a plate or disc in a transport container, said transport container including:
a cover sealingly engaging said container, said cover having a valve attached thereto, said valve connected to a flexible hose for evacuating or admitting inert gas within said container;
a support column extending from said cover within said container, said support column attached at one end to said cover, and at an opposite end to said plate or disc, said plate or disc having at least one magnetic plug; and
said fixture magnetized to releasably attach to said magnetic plug.

2. The fixture and die combination of claim 1 wherein said fixture is removable from said holder and attachable to an ion milling platen.

3. The fixture and die combination of claim 2 wherein said at least one magnetic plug is embedded within said bottom surface plate or disc.

4. The fixture and die combination of claim 1, wherein said fixture mates to conventional mechanical polishing and analytical tools, but permits subsequent low voltage collimated ion milling with SIMS endpoint to allow precise, reproducible delayering without optical or SEM inspection methods, said low voltage in the range of 50 eV to 300 eV.

5. A method for providing a low voltage inert collimated ion beam milling to achieve reproducible, uniform, planar processing of a sample surface for subsequent scanning, said method including:
obtaining a sample and identifying the failing site or region of interest on said sample;
mounting said sample onto a mobile fixture;
mounting said fixture onto a holder;
mounting said holder onto a tool mount stub;
performing a preparation process;
demounting said holder from said tool mount stub;
mounting said holder on an examination tool stub;
determining said region of interest, if said region of interest is too far repeat said method steps beginning with obtaining said sample and identifying said failing site, if said region of interest is not available, repeating said method steps beginning with mounting said holder on said tool mount stub, if said region of interest is obtained, demounting said holder from said examination tool stub; and
performing SPM or other surface treatment analysis.

6. The method of claim 5 including performing iterative collimated ion milling at low voltages in the range of 50 eV to 300 eV.

7. A method for providing a low voltage inert collimated ion beam milling to achieve reproducible, uniform, planar processing of a sample surface for subsequent SPM/SSRM scanning, said method includes providing:
mounting a sample on a fixture having an increased height to expose said sample top surface in a height or Z-direction;
mounting said fixture on an SSRM/SCM holder for fixing a surface scan area for iterative collimated ion milling removal;
mounting said holder to an ion milling platen;
performing collimated ion milling on said sample;
performing a SIMS endpoint detection associated with said collimated ion milling; and
performing SSRM/SCM imaging of said sample without incident ion beam damage.

8. The method of claim 7 wherein said collimated ion milling includes rotating an angular focused low kV inert argon beam to a precise region of interest on said sample surface that eliminates a need for SEM inspection.

9. The method of claim 7 wherein an increase in height of said sample in said Z-direction permits iterative collimated ion milling at low voltages in the range of 50 eV to 300 eV of said scanned region of interest.

10. The method of claim 7 wherein a modification of existing collimated ion milling shutter assemblies uses spacers to increase height in said Z-direction for spacing between said shutter and said sample.

11. A container for transporting and securing at least one die for surface preparation and measurement, said container comprising:
- a cover sealingly engaging said container, said cover having a valve attached thereto, said valve connected to a flexible hose for evacuating or admitting inert gas within said container;
- a support column extending from said cover within said container, said support column attached at one end to said cover, and at an opposite end to a plate or disc, said plate or disc having at least one magnetic plug; and
- at least one fixture for securing said at least one die in a fixed position, said fixture magnetized to releasably attach to said magnetic plug.

12. The container of claim 11 wherein said measurement includes: atomic force probing, scanning spreading resistance microscopy (SSRM), scanning capacitance microscopy, scanning electron microscope nano-probing, scanning probe microscopy, or secondary ion mass spectrometry, or any combination thereof.

13. The container of claim 11 wherein said at least one magnetic plug is embedded within said bottom surface plate or disc.

14. The container of claim 11 wherein said at least one fixture is magnetized stainless steel.

* * * * *